(12) United States Patent
Okada et al.

(10) Patent No.: US 8,910,448 B2
(45) Date of Patent: Dec. 16, 2014

(54) ROOF-INSTALLED OBJECT SECURING DEVICE

(71) Applicant: Yanegijutsukenkyujo Co., Ltd., Takahama-shi, Aichi (JP)

(72) Inventors: Koji Okada, Takahama (JP); Katsuyuki Okado, Takahama (JP)

(73) Assignee: Yanegijutsukenkyujo Co., Ltd., Takahama-Shi (JP)

(*) Notice: Subject to any disclaimer, the term of this patent is extended or adjusted under 35 U.S.C. 154(b) by 0 days.

(21) Appl. No.: 14/263,194

(22) Filed: Apr. 28, 2014

(65) Prior Publication Data

US 2014/0331593 A1  Nov. 13, 2014

(30) Foreign Application Priority Data

May 9, 2013  (JP) .................................. 2013-099023

(51) Int. Cl.
| | | |
|---|---|---|
| *E04B 1/38* | (2006.01) | |
| *E04B 1/41* | (2006.01) | |
| *H01L 31/042* | (2014.01) | |
| *F24J 2/52* | (2006.01) | |

(52) U.S. Cl.
CPC .............. *E04B 1/40* (2013.01); *H01L 31/0422* (2013.01); *F24J 2/5245* (2013.01); *E04B 2001/405* (2013.01)
USPC .......................................................... 52/705

(58) Field of Classification Search
USPC ............... 52/705, 698, 90.1, 91.3, 94, 95, 96
See application file for complete search history.

(56) References Cited

U.S. PATENT DOCUMENTS

| | | | | |
|---|---|---|---|---|
| 4,158,276 | A * | 6/1979 | Stoneman ........................ | 52/219 |
| 5,546,713 | A * | 8/1996 | Voegele et al. ................. | 52/202 |
| 7,168,210 | B2 * | 1/2007 | Krovats ........................ | 52/167.9 |
| 7,921,607 | B2 * | 4/2011 | Thompson et al. ............... | 52/60 |
| 8,316,617 | B2 * | 11/2012 | Krovats ..................... | 52/746.11 |
| 8,833,031 | B2 * | 9/2014 | Steffen ........................... | 52/704 |
| 2005/0241240 | A1 * | 11/2005 | Parker ............................ | 52/2.17 |
| 2014/0208664 | A1 * | 7/2014 | Schaefer et al. .................. | 52/58 |

FOREIGN PATENT DOCUMENTS

| | | |
|---|---|---|
| JP | 3450123 B2 | 12/1997 |
| JP | 2004-278110 A | 10/2004 |

* cited by examiner

*Primary Examiner* — Mark Wendell
*Assistant Examiner* — Keith Minter
(74) *Attorney, Agent, or Firm* — Yoshida & Associates, LLC

(57) ABSTRACT

The roof-installed object securing device includes a flat plate-like securing roof member that is mounted on a roof structural member and has a through-hole penetrating through the securing roof member, a securing member having a flat plate-like mounting piece that made to abut against the roof structural member, an erected portion that is erected from the mounting piece through the through-hole, an installing portion that is formed on the upper end of the erected portion, and a slit that penetrates through the installing portion, an external thread member having a head that abuts against the lower surface of the installing portion and a bar-like external thread portion extending upward from the head through the slit, and a cover member through which the external thread portion penetrates and that covers the through-hole. A roof-installed object is secured onto the external thread portion extending upward from the cover member.

4 Claims, 6 Drawing Sheets

ROOF-INSTALLED OBJECT SECURING DEVICE

CROSS REFERENCE TO RELATED APPLICATIONS

This application claims to the benefit of priority to Japanese Patent Application No. 2013-099023 filed on May 9, 2013, of which full contents are incorporated herein by reference.

BACKGROUND OF THE INVENTION

1. Field of the Invention

The present invention relates to a roof-installed object securing device for securing a roof-installed object to be installed on roof, such as a solar cell module, onto a roof structural member.

2. Description of the Related Art

The present applicant has proposed the following supporting tile as a securing device for securing a roof-installed object (for example, solar cell module, solar water heater, roof-installed greening body) to be installed on roof onto a roof structural member such as roofboard and rafter (Japanese Patent No. 3450123). The supporting tile includes a tile main body which is formed to have a shape substantially the same as a roof member (roof tile) thatched on the roof structural member and is mounted on the roof structural member and a supporting projection projecting upward from the upper surface center portion of the tile main body, and the roof-installed object is secured onto the supporting projection.

However, in the technique as disclosed in Japanese Patent No. 3450123), the weight of the roof-installed object acts on the supporting tile overall, so that the supporting tile is formed with a metal having high strength and rigidity for enduring the weight thereof. Due to this, there is room for improvement in that the cost required for the supporting tile (securing device) is increased.

On the other hand, the following securing device has been proposed (Japanese Patent Application Laid-open No. 2004-278110). The securing device includes a cover member that is installed on a roof structural member and is formed to have a shape substantially the same as a roof member and on which a rectangular through-hole is formed and a supporting member that is inserted into the through-hole of the cover member and is mounted on the roof structural member. A roof-installed object is secured onto the upper surface of the supporting member on the securing device. In the technique as disclosed in Japanese Patent Application Laid-open No. 2004-278110, the supporting member onto which the roof-installed object is secured is mounted on the roof structural member through the through-hole of the cover member, so that the weight of the roof-installed object does not act on the cover member. This makes it possible to use a material having low strength and rigidity at the relatively reduced cost for the cover member, thereby reducing the cost required for the securing device.

However, in the technique as disclosed in Japanese Patent Application Laid-open No. 2004-278110, the supporting member onto which the roof-installed object is secured is formed to have a U shape by bending a flat plat-like member and is mounted on the roof structural member while free ends of two portions thereof extending in parallel are set to lower ends. With this configuration, the weight of the roof-installed object acts on the lower ends of the two portions extending in parallel in a concentrated manner and the weight of the roof-installed object acts on the roof structural member of a narrow range. This arises a problem that the roof structural member is easy to be damaged.

SUMMARY OF THE INVENTION

In view of the above-mentioned circumstances, an object of the present invention is to provide a roof-installed object securing device capable of suppressing action of the weight of a roof-installed object on a roof structural member of a narrow range in a concentrated manner.

In order to achieve the above object, a roof-installed object securing device according to an aspect of the invention "includes: a securing roof member having a flat plate-like roof member main body that is mounted on a roof structural member, a through-hole that penetrates through the roof member main body in an up-down direction, and a peripheral wall portion that extends upward from a peripheral edge of the through-hole; a securing member having a flat plate-like mounting piece that is located below the roof member main body of the securing roof member, is provided with a plurality of mounting holes, and is made to abut against the roof structural member, an erected portion that is erected upward from the mounting piece to be higher than the peripheral wall portion through the through-hole, a flat plate-like installing portion that extends from an upper end of the erected portion so as to be in parallel with the mounting piece, and a slit that penetrates through the installing portion in an up-down direction; an external thread member having a head that abuts against a lower surface of the installing portion of the securing member and a bar-like external thread portion that extends upward from the head through the slit, and movable along the slit; and a cover member having a flat plate-like top board portion that is provided with a through-hole through which the external thread portion of the external thread member passes, is installed on the installing portion, and extends outward relative to an outer circumference of the peripheral wall portion, and a side plate portion that extends downward from a peripheral edge of the top board portion to a height between an upper end of the peripheral wall portion and an upper surface of the roof member main body, wherein a roof-installed object is secured onto the external thread portion extending upward from the cover member."

The "roof structural member" is a portion located below the roof member of a building and includes roofboard, rafter, and the like. Examples of the "roof-installed object" include a solar cell module, a solar water heater, and a roof-installed greening body.

The "roof member main body" is desirably formed to have a shape same as that of a common roof member (roof tile) thatched on the roof structural member. Examples of the shape thereof can include a hip-and-gable roofing shape, a J shape, an F shape, an S shape, and a Spanish shape.

The "mounting piece" may have such size that it can pass through the through-hole of the roof member main body or such shape that it cannot pass through the through-hole of the roof member main body. Furthermore, a plurality of "erected portions" may be erected from the mounting piece. The "slit" may be a long hole-shaped slit or a slit dividing the installing portion, for example.

Examples of the "external thread member" include a carriage bolt, a hexagon bolt, a pan head bolt, and a hexagon socket head cap bolt. The external thread member that becomes non-rotatable if being inserted into the slit is desirable.

With the roof-installed object securing device according to the aspect of the invention, the flat plate-like mounting piece formed on the lower end of the securing member is mounted on the roof structural member through the mounting hole. In addition, the erected portion is erected upward from the mounting piece to be higher than the peripheral wall portion through the through-hole on the securing roof member that is mounted on the roof structural member. The cover member is installed on the installing portion on the upper end of the securing member so as to cover the peripheral wall portion from above and the external thread portion of the external thread member extends upward from the installing portion while penetrating through the cover member. With this, the roof-installed object is secured onto the extending external thread portion so as to be installed on roof.

On the securing member on which the weight of the roof-installed object acts, the flat plate-like mounting piece abuts against the roof structural member on a plane, thereby dispersing the weight of the roof-installed object onto the roof structural member widely. Accordingly, action of the weight of the roof-installed object on the roof structural member of a narrow range in a concentrated manner can be prevented. This can suppress the problem that the roof structural member is easy to be damaged.

In the technique as disclosed in Japanese Patent Application Laid-open No. 2004-278110, the mounting hole is formed on an upper piece coupling the upper ends of the two portions extending in parallel on the supporting member and a long screw is screwed into the roof structural member through the mounting hole from above so as to mount the supporting member. With this configuration, the head of the screw abuts against the upper surface of the upper piece and a portion of the screw between the upper piece and the roof structural member is exposed to the outside in a state where the supporting member has been mounted. Due to this, if rainwater that has entered on the roof structural member for some reason makes contact with the exposed portion of the screw, there arises a risk that the rainwater flow down the exposed portion of the screw into the roof structural member. On the contrary, in the aspect of the invention, the flat plate-like mounting piece is made to abut against the roof structural member on a plane and the head of the screw for mounting the securing member on the roof structural member through the mounting hole is made to abut against the upper surface of the mounting piece as described above. This can prevent portions of the screw other than the head from being exposed on the roof structural member by sealing between the head of the screw and the mounting piece and between the mounting piece and the roof structural member with rubber, a silicon resin, or the like. Accordingly, even when rainwater enter on the roof structural member, the rainwater can be prevented from entering the roof structural member.

Furthermore, the external thread member is made movable along the slit. Therefore, even after the securing member is mounted on the roof structural member, the position of the external thread portion with respect to the roof structural member can be changed by moving the external thread member along the slit without detaching the securing member. Accordingly, when a bar-like crosspiece member belonging to the roof-installed object is secured by using a plurality of roof-installed object securing devices, for example, if the plurality of roof-installed object securing devices are mounted on the roof structural member such that the slits extend in the direction perpendicular to the lengthwise direction of the crosspiece member to be secured, the external thread portions can be made to be identical to the securing axis line (axial line along which the crosspiece member is to be secured on roof) of the crosspiece member by moving the external thread members along the slits even when the external thread portions are deviated from the securing axial line of the crosspiece member.

The roof-installed object is secured through the installing portion of the securing member extending upward through the through-hole of the securing roof member from below. Therefore, the weight of the roof-installed object does not act on the securing roof member. This makes it possible to use a material having low strength and rigidity at the relatively reduced cost for the securing roof member, thereby reducing the cost required for the roof-installed object securing device.

In the roof-installed object securing device according to the aspect of the invention, it is preferable that "the securing member further include a restricting portion that abuts against the head of the external thread member from below" in addition to the above-mentioned configuration.

Examples of the "restricting portion" include "a member which includes a band plate-like receiving piece, and a pair of folded pieces folded from both the ends of the receiving piece so as to be opposed to each other, and restricts downward movement of the external thread member by installing the head of the external thread member on the upper surface of the receiving piece and engaging the pair of folded pieces with the upper surface of the installing portion", "a fitting groove which is formed on the side surface of the erected portion and into which the head of the external thread member is fitted from the horizontal direction", and "an extending piece which extends below the head of the external thread member from the side surface of the erected portion".

With the roof-installed object securing device according to the aspect of the invention, the restricting portion abuts against the head of the external thread member from below so as to prevent the external thread member from dropping from the installing portion. With this, when the securing member is mounted on the roof structural member and when the roof-installed object is secured onto the external thread portion, the external thread member needs not to be kept being supported so as not to drop. This improves operability when the roof-installed object is installed on roof.

In the roof-installed object securing device according to the aspect of the invention, it is preferable that "the securing member be formed to have such size that the securing member is capable of passing through the through-hole of the securing roof member" in addition to the above-mentioned configuration.

With the roof-installed object securing device according to the aspect of the invention, the securing member can be mounted on the roof structural member through the through-hole from above after the securing roof member is mounted on the roof structural member. This can simplify a mounting operation of the roof-installed object securing device on the roof structural member. As described in detail, if the securing member has such size that it cannot pass through the through-hole, the securing roof member needs to be mounted on the roof structural member such that the erected portion passes through the through hole after the securing member is mounted on the roof structural member. In this case, if the securing member is mounted on the roof structural member while being deviated from a right mounting position, the center of the through-hole of the securing roof member through which the erected portion of the securing member is inserted is also deviated from a right position of the roof structural member. This arises a problem that the securing roof member are deviated from the roof member on the roof structural member. In order to avoid this problem, the securing member needs to be mounted at the right mounting position with high accuracy, resulting in a problem that a troublesome work is required to mount the securing member.

As for this point, in the aspect of the invention, the securing member can pass through the through-hole. Therefore, the securing member can be mounted on the roof structural member after the securing roof member is mounted. With this, the securing member can be easily mounted at the right mounting position by mounting the securing member on the roof structural member from above through the through-hole after the securing roof member is mounted so as to be aligned with positions of other roof members. This can simplify amounting operation of the securing member on the roof structural member.

According to the invention, a roof-installed object securing device capable of suppressing action of the weight of a roof-installed object on the roof structural member of a narrow range in a concentrated manner can be provided.

DESCRIPTION OF THE EMBODIMENTS

Figure 1:
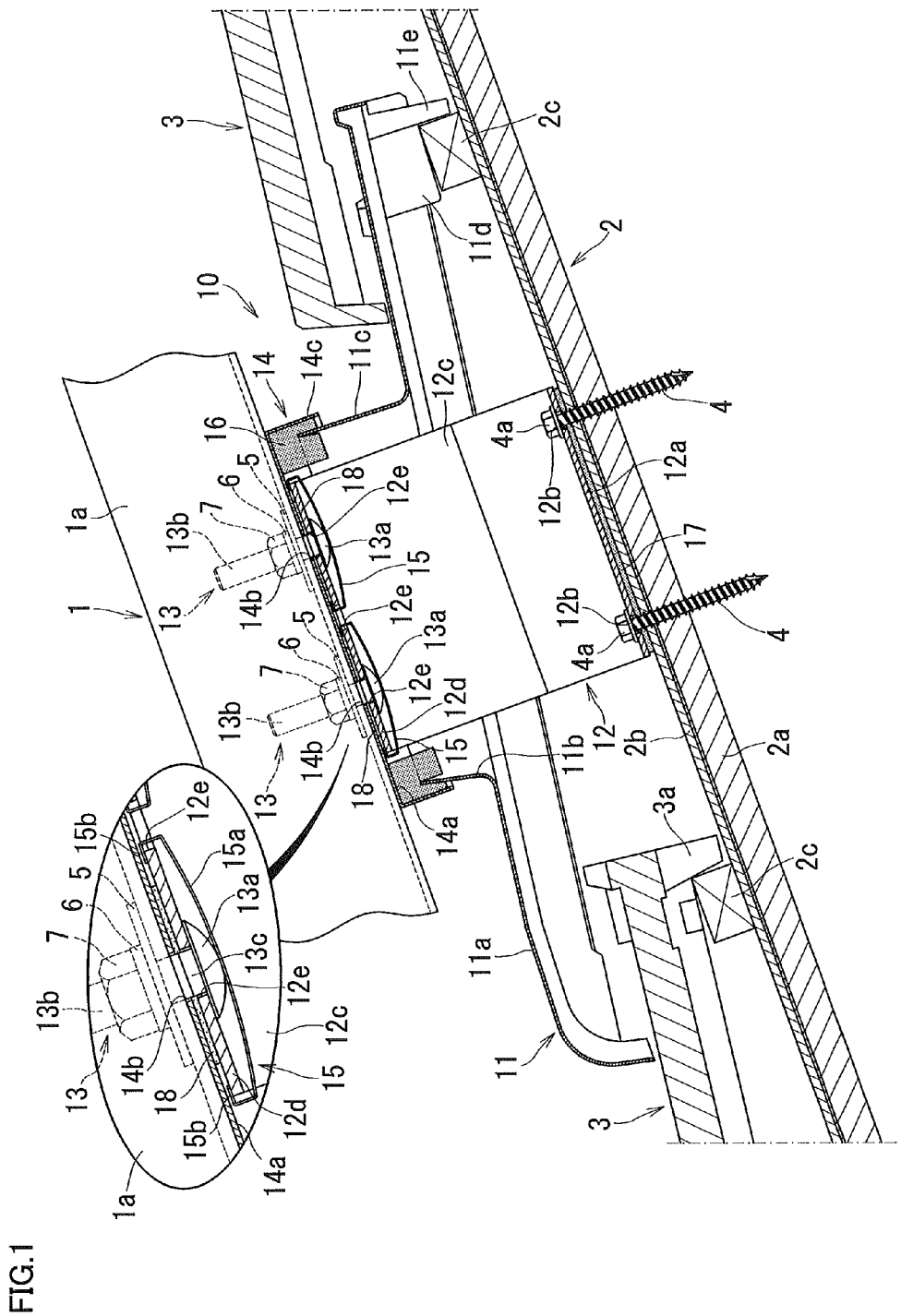
FIG. 1 is a cross-sectional view illustrating a state where a roof-installed object securing device as an embodiment of the invention is mounted on a roof structural member so as to secure a roof-installed object.

A roof-installed object securing device 10 (hereinafter, referred to as securing device 10 simply) as an embodiment of the invention is described in detail with reference to FIG. 1 to FIG. 3. The securing device 10 in the embodiment is a device for installing a crosspiece member 1a forming a lower portion of a roof-installed object 1 to be installed on roof, such as a solar cell module, a solar water heater, and a roof-installed greening body, on a roof structural member 2.

The roof structural member 2 includes a roofboard 2a mounted on the upper surface of rafter (not illustrated), a sheet-like cover member 2b that is laid on the upper surface of the roofboard 2a and has water-proof performance, and bar-like crosspiece trees 2c that are mounted on the upper surface of the cover member 2b at a constant interval in the roof inclination direction. A roof member 3 thatched on the roof structural member 2 includes a projecting portion 3a projecting downward on a ridge-side end (right end in FIG. 1). The roof member 3 is mounted on the roofboard 2a with nails (not illustrated) or the like in a state where the projecting portion 3a is engaged with the crosspiece trees 2c.

The securing device 10 in the embodiment includes a securing roof member 11, a securing member 12, external thread members 13, a cover member 14, restricting members 15, and a water-proof member 16. The securing roof member 11 is formed to have a shape substantially the same as the roof member 3 such as a roof tile thatched on the roof structural member 2 and is mounted on the roof structural member 2. The securing member 12 penetrates through the securing roof member 11 in the up- and down direction and is mounted on the roof structural member 2. The external thread members 13 are mounted on the upper end of the securing member 12. Parts of the external thread members 13 penetrate through the cover member 14 and the cover member 14 covers an upper portion of the securing member 12. The restricting members 15 are mounted on the securing member 12 and restrict downward movement of the external thread members 13. The water-proof member 16 seals between the securing roof member 11 and the cover member 14 in a watertight manner. The crosspiece member 1a is secured by the external thread members 13 of the securing device 10.

The securing roof member 11 includes a flat plate-like roof member main body 11a, a through-hole 11b, and a peripheral wall portion 11c. The roof member main body 11a is mounted on the roof structural member 2. The through-hole 11b penetrates through the roof member main body 11a in the up-down direction. The peripheral wall portion 11c extends upward from the peripheral edge of the through-hole 11b. The roof member main body 11a is formed to have an outer shape that is substantially the same as the roof member 3. The through-hole 11b penetrates through the roof member main body 11a at the center and is formed to have an inner circumferential shape of pentagon. The pentagonal inner circumference of the through-hole 11b is shaped by bending one side of four sides forming a square shape at the center so as to form two oblique sides that project outward. The through-hole 11b is formed such that an apex at which two oblique sides intersect with each other directs to the ridge of roof when the securing roof member 11 is mounted on the roof structural member 2 (see, FIG. 2 and the like). With this, rainwater flowing from the ridge side can be made to flow in the lateral direction (direction perpendicular to a paper plane in FIG. 1) of roof with the peripheral wall portion 11c extending from the peripheral edge of the through-hole 1ib. The upper end of the peripheral wall portion 11c is inclined with respect to the upper surface of the roof member main body 11a and is formed so as to be substantially parallel with the upper surface of the roof structural member 2 when the securing roof member 11 is mounted on the roof structural member 2.

The securing roof member 11 includes a base portion 11d and a projecting portion 11e. The base portion 11d projects downward from one end (right end in FIG. 1) and is installed on the crosspiece trees 2c of the roof structural member 2. The projecting portion 11e extends downward from one end of the base portion 11d and is engaged with the crosspiece trees 2c. The securing roof member 11 is formed with a metal such as aluminum alloy, a synthetic resin having weather resistance, or the like.

The securing member 12 includes a pair of flat plate-like mounting pieces 12a, a plurality of mounting holes 12b, a pair of flat plate-like erected portions 12c, a flat plate-like installing portion 12d, and a plurality of slits 12e. The pair of mounting pieces 12a are arranged with a space in between and abut against the roof structural member 2. The respective mounting holes 12b penetrate through the pair of the mounting pieces 12a. The pair of erected portions 12c are erected upward from the outer sides of the pair of mounting pieces 12a at the side opposite to the inner sides thereof opposing to each other, respectively. The installing portion 12d couples the upper ends of the pair of erected portions 12c and extends in parallel with the mounting pieces 12a. The slits 12e penetrate through the installing portion 12d in the up-down direction.

Each of the pair of erected portions 12c is formed into a crank form. To be specific, the erected portions 12c are erected to a predetermined height from the mounting pieces 12a, and then, are bent inward and extend to positions above the inner sides of the mounting pieces 12a so as to be in parallel with the mounting pieces 12a, and are further bent upward. With this configuration, the erected portions 12c include step portions 12f extending in parallel with the mounting pieces 12a. Insertion holes 12g are formed on the step portions 12f just above the mounting holes 12b. The insertion holes 12g are formed in size such that heads 4a of screws 4 for mounting the securing member 12 on the roof structural member 2 can pass through the insertion holes 12g.

The slits 12e are formed to have long hole shapes elongated in the direction in which the pair of mounting pieces 12a are spaced from each other. The plurality of (in the embodiment, three) slits 12e are arranged in row in the direction perpendicular to the direction in which the pair of mounting pieces 12a are spaced from each other.

The securing member 12 is formed to have a height such that the installing portion 12d on the upper surface thereof is located higher than the upper end of the peripheral wall portion 11c of the securing roof member 11 when being mounted on the roof structural member 2. The securing member 12 is formed by bending one plate material so as to form the pair of mounting pieces 12a, the pair of erected portions 12c, and the installing portion 12d integrally. The securing member 12 in the embodiment is formed by a metal plate such as stainless steel.

The external thread members 13 in the embodiment are formed by carriage bolts. Each external thread member 13 includes a head 13a, a bar-like external thread portion 13b extending from the head 13a, and a square root portion 13c that is formed between the external thread portion 13b and the head 13a and has the outer circumference of a square shape. The length of one side of the square root portion 13c is slightly smaller than the width of each slit 12e of the securing member 12. With this, even when the external thread member 13 is tried to be rotated in a state where the square root portion 13c is inserted into the slit 12e, the external thread member 13 can be prevented from being rotated because the two sides of the square root portion 13c, which extend in parallel, abut against the inner wall of the slit 12e.

The cover member 14 includes a flat plate-like top board portion 14a having the outer shape of pentagon, through-holes 14b penetrating through the top board portion 14a, and a side plate portion 14c extending downward from the peripheral edge of the top board portion 14a. The top board portion 14a is formed to have a shape along the outer circumference of the peripheral wall portion 11c of the securing roof member 11 so as to be larger than the outer circumference. The through-holes 14b are formed in accordance with the number and the positions of the external thread portions 13b extending upward from the installing portion 12d of the securing member 12. The cover member 14 in the embodiment is formed by a metal plate such as stainless steel and aluminum alloy, a synthetic resin having excellent weather resistance, or the like.

Each restricting member 15 includes a band plate-like receiving piece 15a, and a pair of folded pieces 15b which are folded from both the ends of the receiving piece 15a so as to be opposed to each other. The receiving pieces 15a of the restricting members 15 are positioned under the heads 13a and the pair of folded pieces 15b thereof are engaged with the upper surface of the installing portion 12d in a state where the external thread portions 13b of the external thread members 13 are inserted into the slits 12e on the securing member 12 from below and the heads 13a are made to abut against the lower surface of the installing portion 12d. With this, the restricting members 15 can restrict the downward movement of the external thread members 13. In the embodiment in FIG. 1, one folded pieces 15b of the restricting members 15 are engaged with the upper surface of the installing portion 12d through the slit 12e and the other folded pieces 15b of the restricting members 15 are engaged with the upper surface of the installing portion 12d from the outer sides relative to the ends of the installing portion 12d. The restricting member 15 corresponds to a restricting portion in the invention.

The waterproof member 16 is mounted at the inner side of the cover member 14. As illustrated in FIG. 1, the waterproof member 16 can seal between the peripheral wall portion 11c of the securing roof member 11 and the side plate portion 14c of the cover member 14 in a watertight manner so as to prevent rainwater from entering the through-hole 11b (on the roof structural member 2). The waterproof member 16 in the embodiment is formed by a foam rubber obtained by foaming rubber such as ethylene propylene diene rubber (EPDM).

Subsequently, a method of securing the roof-installed object 1 by using the securing device 10 in the embodiment is described. First, the securing roof member 11 is mounted on the roof structural member 2 at a position at which the securing device 10 is to be mounted. When the plurality of roof members 3 have been already thatched on the roof structural member 2, the roof member 3 at the position at which the securing device 10 is to be mounted is detached and the securing roof member 11 is mounted instead of the roof member 3. The securing roof member 11 is mounted on the roof structural member 2 in the following manner. That is, the base portion 11d of the securing roof member 11 is installed on the crosspiece trees 2c of the roof structural member 2 and the projecting portion 11e is engaged with the crosspiece trees 2c. Then, the nails (not illustrated) are driven into the crosspiece trees 2c from above the roof member main body 11a.

On the other hand, the external thread members 13 are mounted on the securing member 12 before the securing member 12 is mounted on the roof structural member 2. In the embodiment, the external thread portions 13b of the two external thread members 13 are inserted into the two slits 12e of the three slits 12e aligned on the installing portion 12d in row other than the center slit 12e from below, respectively, and the heads 13a thereof are made to abut against the lower surface of the installing portion 12d. With this, the square portions 13c of the external thread members 13 are located in the slits 12e. Therefore, the square portions 13c and the slits 12e make the external thread members 13 movable along the slits 12e in a non-rotatable manner.

The receiving pieces 15a of the restricting members 15 are located under the heads 13a and the folded pieces 15b at both the ends thereof are engaged with the upper surface of the installing portion 12d in the state where the heads 13a of the external thread members 13 are made to abut against the lower surface of the installing portion 12d. With this, the downward movement of the external thread members 13 is restricted and the external thread members 13 are mounted on the securing member 12.

Then, the securing member 12 on which the two external thread members 13 are mounted is mounted on the roof structural member 2. To be specific, the securing member 12 is directed such that the two external thread members 13 are aligned in the roof inclination direction and is inserted into the through-hole 11b of the securing roof member 11 mounted on the roof structural member 2 from above, so that the pair of mounting pieces 12a are made to abut against the roof structural member 2. Thereafter, the screws 4 are screwed into the roof structural member 2 through the insertion holes 12g and the mounting holes 12b from above the step portions 12f, so that the securing member 12 is mounted on the roof structural member 2. In this case, the diameter of the insertion holes 12g on the step portions 12f is larger than that of the heads 4a of the screws 4. Therefore, the heads 4a of the screws 4 are made to abut against the upper surfaces of the mounting pieces 12a on which the mounting holes 12b are formed after passing through the insertion holes 12g.

When the securing member 12 is mounted, the screws 4 each having the length that makes it possible to penetrate through the roofboard 2a and the cover member 2b of the roof structural member 2 and is longer than the height from the mounting pieces 12a to the step portions 12f of the securing member 12 are used. With this, when the front ends of the screws 4 are inserted into the mounting holes 12b on the mounting pieces 12a so as to be screwed into the roof structural member 2 after passing through the insertion holes 12g on the step portions 12f, even when the screws 4 are about to fall down, the intermediate portions of the screws 4 are supported by the insertion holes 12g so as to prevent the screws 4 from falling down. Accordingly, a screwing operation of the screws 4 into the roof structural member 2 (mounting operation of the securing member 12) is easy to be performed.

When the securing member 12 is mounted, a sheet-like sealing member 17 formed by butyl rubber or the like is inserted into between the pair of mounting pieces 12a and the roof structural member 2. The sealing member 17 may be bonded to the lower surfaces of the mounting pieces 12a previously. The sealing member 17 can prevent rainwater from flowing down the screws 4 and entering into or downward from the roof structural member 2.

After the securing member 12 is mounted on the roof structural member 2, flat plate-like waterproof members 18 formed by rubber and having holes are fitted to the external thread portions 13b of the two external thread members 13 extending upward from the installing portion 12d, respectively. Subsequently, the cover member 14 is made closer from above the external thread portions 13b and the external thread portions 13b are inserted through the through-holes 14b. Then, the top board portion 14a is installed on the installing portion 12d with the waterproof members 18 interposed therebetween. With this, the upper space of the through-hole 11b of the securing roof member 11 is covered by the cover member 14 and the two external thread portions 13b extend upward from the top board portion 14a of the cover member 14. The waterproof member 16 mounted at the inner side of the cover member 14 seals between the securing roof member 11 and the cover member 14 (between the peripheral wall portion 11b and the side plate portion 14c) in a watertight manner.

The crosspiece member 1a constituting the roof-installed object 1 is secured to the two external thread portions 13b extending upward from the cover member 14. To be specific, the external thread portions 13b are inserted through securing holes (not illustrated) formed on the bottom surface of the crosspiece member 1a and the crosspiece member 1a is installed on the top board portion 14a of the cover member 14. Thereafter, plain washers 5 and spring washers 6 are fitted to the external thread portions 13b penetrating through the securing holes of the crosspiece member 1a in this order. Furthermore, nuts 7 are screwed and tightened on the external thread portions 13b, so that the crosspiece member 1a can be secured onto the cover member 14. With this, the roof-installed object 1 is installed on the roof structural member 2 with the securing device 10.

If the external thread portions 13b are deviated with respect to a securing axial line of the crosspiece member 1a (axial line along which the crosspiece member 1a is to be secured on roof) when the crosspiece member 1a is mounted, the external thread portions 13b (external thread members 13) can be made to be identical to the securing axis line by sliding the external thread portions 13b along the slits 12e.

In the above-mentioned securing method, the crosspiece member 1a is secured directly onto the external thread portions 13b extending upward from the cover member 14. However, a crosspiece securing member 8 may be interposed between the external thread portions 13b and the crosspiece member 1a, as illustrated in FIG. 3. First, the crosspiece securing member 8 is described. The crosspiece securing member 8 includes a flat plate-like bottom plate 8a, a long hole-shaped mounting hole 8b, a pair of installing pieces 8c, a pair of securing pieces 8d, and long hole-shaped securing holes 8e. The bottom plate 8a is formed into a square shape. The mounting hole 8b penetrates through the bottom plate 8a at the center. The pair of installing pieces 8c extend upward from two sides among four sides of the bottom plate 8a so as to be in parallel with the direction in which the mounting hole 8b extends. The pair of securing pieces 8d extend upward from the other two sides of the bottom plate 8a so as to be higher than the installing pieces 8c. The securing holes 8e penetrate through the pair of securing pieces 8d, respectively, and extend in the up-down direction. The crosspiece securing member 8 is formed such that the crosspiece member 1a is inserted into between the pair of securing pieces 8d.

When the crosspiece member 1a is secured by using the crosspiece securing member 8, the external thread member 13 and the restricting member 15 are mounted on the slit 12e at the center among the three slits 12e on the securing member 12 with the procedures same as those as described above. Furthermore, as the cover member 14, the cover member 14 on which one through-hole 14b corresponding to the number of external thread member 13 mounted on the securing member 12 is formed is used. Then, the securing roof member 11, the securing member 12, and the cover member 14 are mounted on the roof structural member 2 with the procedures same as those as described above, and then, the crosspiece securing member 8 is mounted on the external thread portion 13b extending upward from the cover member 14.

When the crosspiece securing member 8 is mounted on the external thread portion 13b, the external thread portion 13b is inserted through the mounting hole 8b penetrating through the bottom plate 8a of the crosspiece securing member 8 from below and the crosspiece securing member 8 is installed on the top board portion 14a of the cover member 14. Thereafter, the plain washer 5 and the spring washer 6 are fitted to the external thread portion 13b penetrating through the bottom plate 8a of the crosspiece securing member 8 in this order. Furthermore, the nut 7 is screwed and tightened on the external thread portion 13b, so that the crosspiece securing member 8 can be secured onto the cover member 14. The crosspiece securing member 8 is mounted such that the pair of securing pieces 8d are in parallel with the direction in which the crosspiece member 1a extends.

The crosspiece member 1a is inserted into between the pair of securing pieces 8d and the lower surface of the crosspiece member 1a is made to abut against the upper ends of the pair of installing pieces 8c. Thereafter, bolts 9 inserted through the spring washers 6, the plain washers 5, and the securing holes 8e are screwed and tightened into nuts (not illustrated) held by the crosspiece member 1a from the outsides of the respective securing pieces 8d, so that the crosspiece member 1a is secured onto the crosspiece securing member 8. With this, the roof-installed object 1 is installed on the roof structural member 2 with the securing device 10.

Thus, with the securing device 10 in the embodiment, the securing member 12 on which the weight of the roof-installed object 1 acts is mounted while the flat plate-like mounting pieces 12*a* are made to abut against the roof structural member 2 on a plane. Therefore, the weight of the roof-installed object 1 can be dispersed on the roof structural member 2 widely. Accordingly, action of the weight of the roof-installed object 1 on the roof structural member 2 of the narrow range in a concentrated manner can be prevented. This can suppress the problem that the roof structural member 2 is easy to be damaged.

Furthermore, the flat plate-like mounting pieces 12*a* are made to abut against the roof structural member 2 on a plane. With this, if the sealing member 17 seals between the mounting pieces 12*a* and the roof structural member 2, even when rainwater enter on the roof structural member 2, the rainwater can be prevented from flowing down the screws 4 and entering the roof structural member 2.

In addition, the external thread members 13 are made to be movable along the slits 12*e* on the securing member 12. Therefore, even after the securing member 12 is mounted on the roof structural member 2, the positions of the external thread portions 13*b* can be changed with respect to the roof structural member 2 by moving the external thread members 13 along the slits 12*e* without detaching the securing member 12. This can make the external thread portions 13*b* be identical to the securing axial line of the crosspiece member 1*a*.

The securing member 12 onto which the roof-installed object 1 is secured is mounted on the roof structural member 2 through the through-hole 11*b* of the securing roof member 11, so that the weight of the roof-installed object 1 does not act on the securing roof member 11. This makes it possible to use a material having low strength and rigidity at the relatively reduced cost for the securing roof member 11, thereby reducing the cost required for the securing device 10.

Furthermore, the restricting portions 15 can prevent the external thread members 13 from dropping from the installing portion 12*d*. With this, when the securing member 12 is mounted on the roof structural member 2 and when the roof-installed object 1 is secured onto the external thread portions 13*b*, the external thread members 13 need not to be kept being supported so as not to drop. This improves operability when the roof-installed object 1 is installed on roof.

The securing member 12 can pass through the through-hole 11*b* of the securing roof member 11, so that the securing member 12 can be mounted on the roof structural member 2 after the securing roof member 11 is mounted. With this, the securing member 12 can be easily mounted at the right mounting position by mounting the securing member 12 on the roof structural member 2 from above through the through-hole 11*b* after the securing roof member 11 is mounted so as to be aligned with the positions of other roof members 3. This can simplify a mounting operation on the roof structural member 2.

Furthermore, the securing member 12 includes the step portions 12*f* at the height between the mounting pieces 12*a* and the installing portion 12*d* and the insertion holes 12*g* having the same axes as the mounting holes 12*b* are formed on the step portions 12*f*. Therefore, a distance between the mounting holes 12*a* and the insertion holes 12*g* can be made smaller than that in the case where the insertion holes 12*g* are formed on the installing portions 12*d*. With this, the mounting holes 12*a* can be easy to be checked through the insertion holes 12*g*, so that the front ends of the screws 4 are easy to be inserted into the mounting holes 12*a* through the insertion holes 12*g*.

If the insertion holes 12*g* are formed on the installing portion 12*d*, the length of the screws 4 needs to be longer than the height from the mounting pieces 12*a* to the installing portion 12*d* in order to insert the front ends of the screws 4 into the mounting holes 12*a* from above the insertion holes 12*g*. In contrast, in the embodiment, the insertion holes 12*g* are formed on the step portions 12*f* at the height between the mounting pieces 12*a* and the installing portion 12*d*. This can make the length of the screws 4 shorter relatively.

Figure 2:
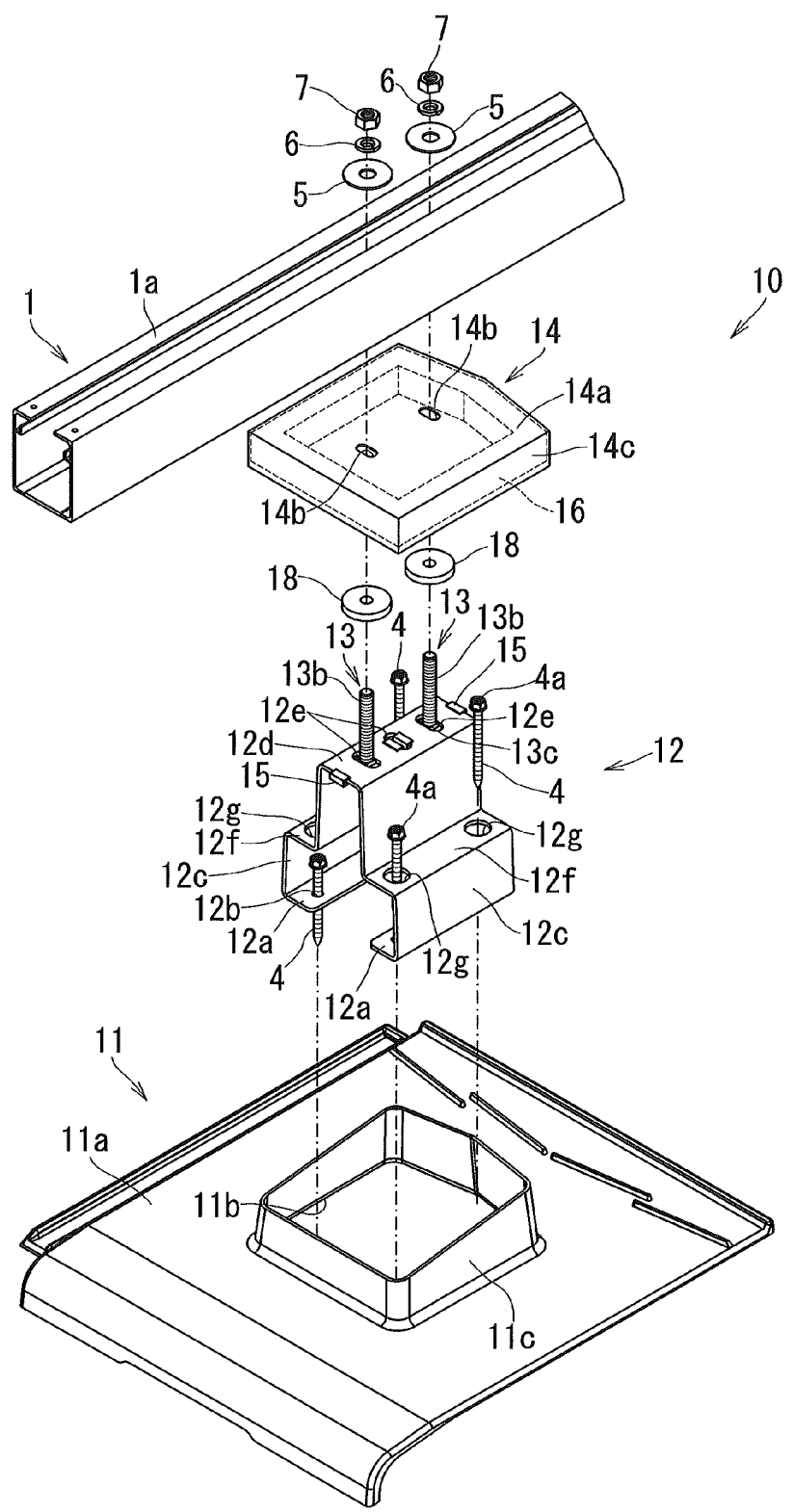
FIG. 2 is a perspective view illustrating the roof-installed object securing device in FIG. 1 in an exploded manner.

As illustrated in FIG. 1 and FIG. 2, when the two external thread members 13 are mounted on the securing member 12, the two external thread members 13 can secure the roof-installed object 1. This can secure the roof-installed object 1 onto the roof structural member 2 firmly.

Figure 3:
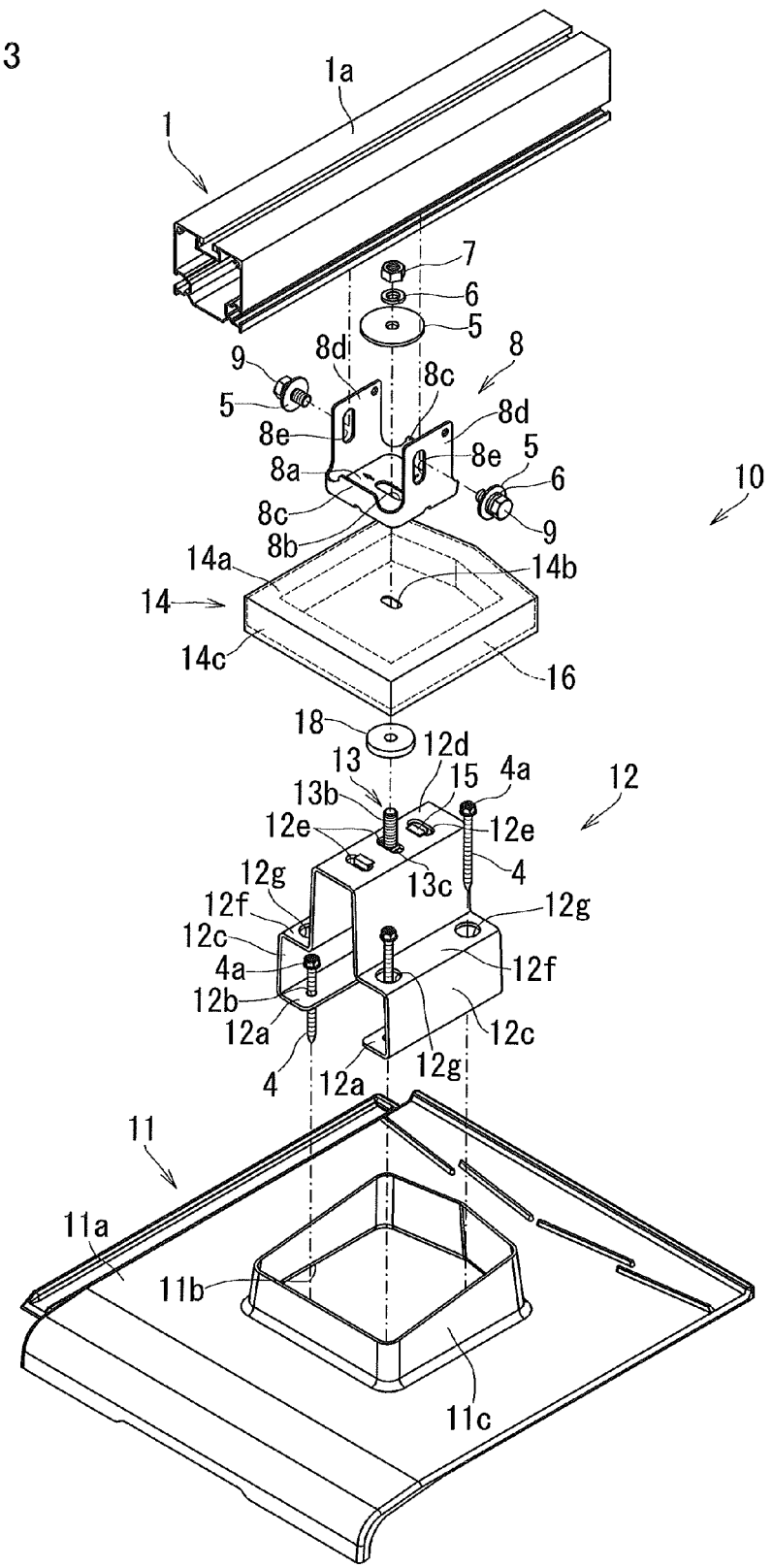
FIG. 3 is a perspective view illustrating another application example of the roof-installed object securing device in FIG. 1 in an exploded manner.

As illustrated in FIG. 3, when the roof-installed object 1 is secured by using the crosspiece securing member 8, the mounting hole 8*b* of the crosspiece securing member 8 is formed as a long hole elongated in the direction perpendicular to the direction in which the crosspiece member 1*a* extends (securing axial line). Therefore, even when the external thread member 13*b* is deviated from the securing axial line of the crosspiece member 1*a*, the position can be also adjusted with the crosspiece securing member 8 in addition to the securing member 12 so as to cope with larger deviation.

As described above, the invention has been described by using the preferable embodiment. However, the invention is not limited to the above-mentioned embodiment and various improvements and change in design can be made in a range without departing from the scope of the invention.

For example, although the securing member 12 includes the erected portions 12*c* that are erected upward from the outer sides of the pair of mounting pieces 12*a* in the above-mentioned embodiment, the configuration thereof is not limited thereto. Alternatively, the erected portions 12*c* may be erected from the inner sides of the pair of mounting pieces 12*a*.

Figure 4:
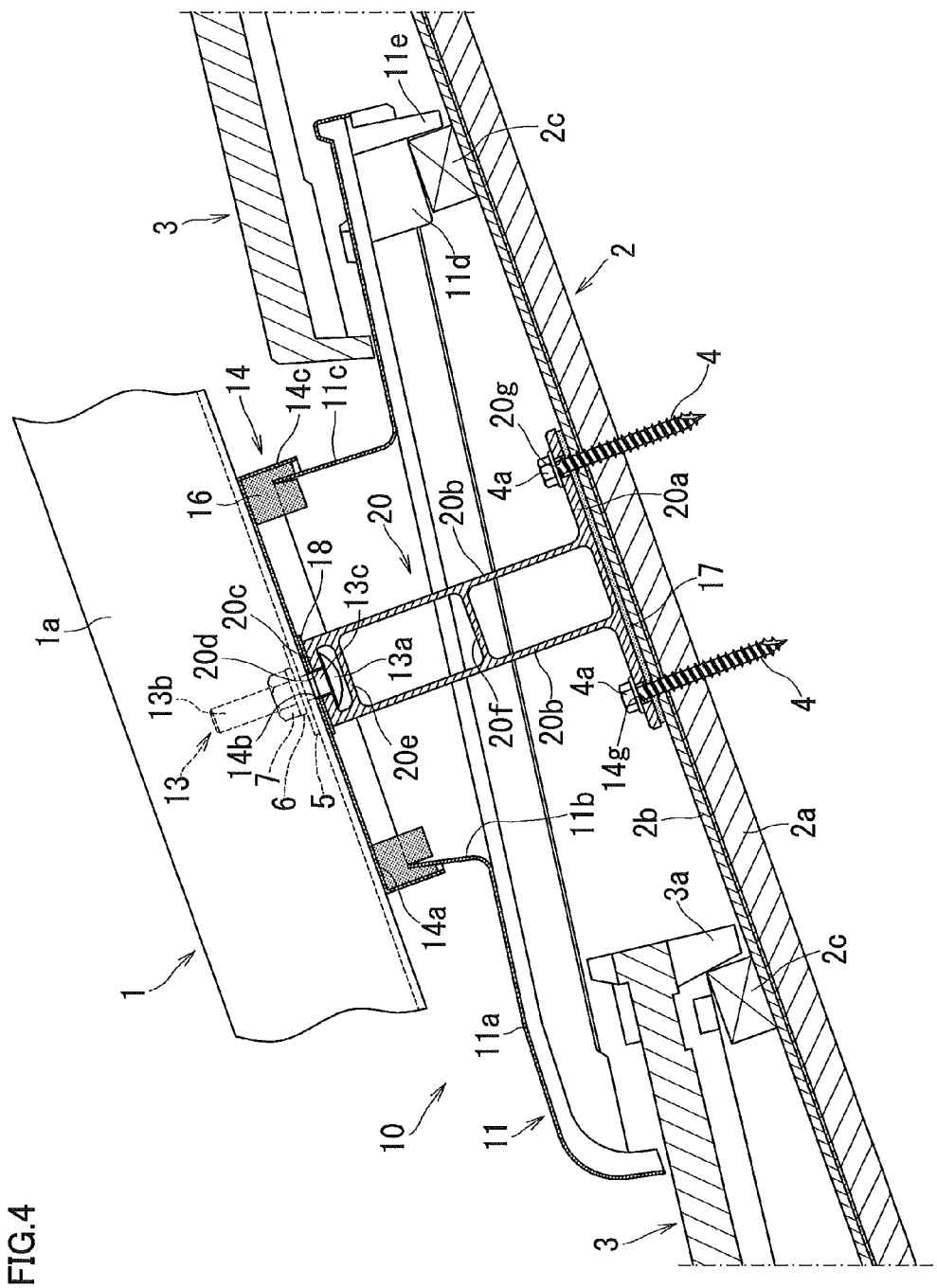
FIG. 4 is a cross-sectional view illustrating a state where the roof-installed object is secured by using a securing member in a mode different from a securing member of the roof-installed object securing device in FIG. 1.
Figure 5:
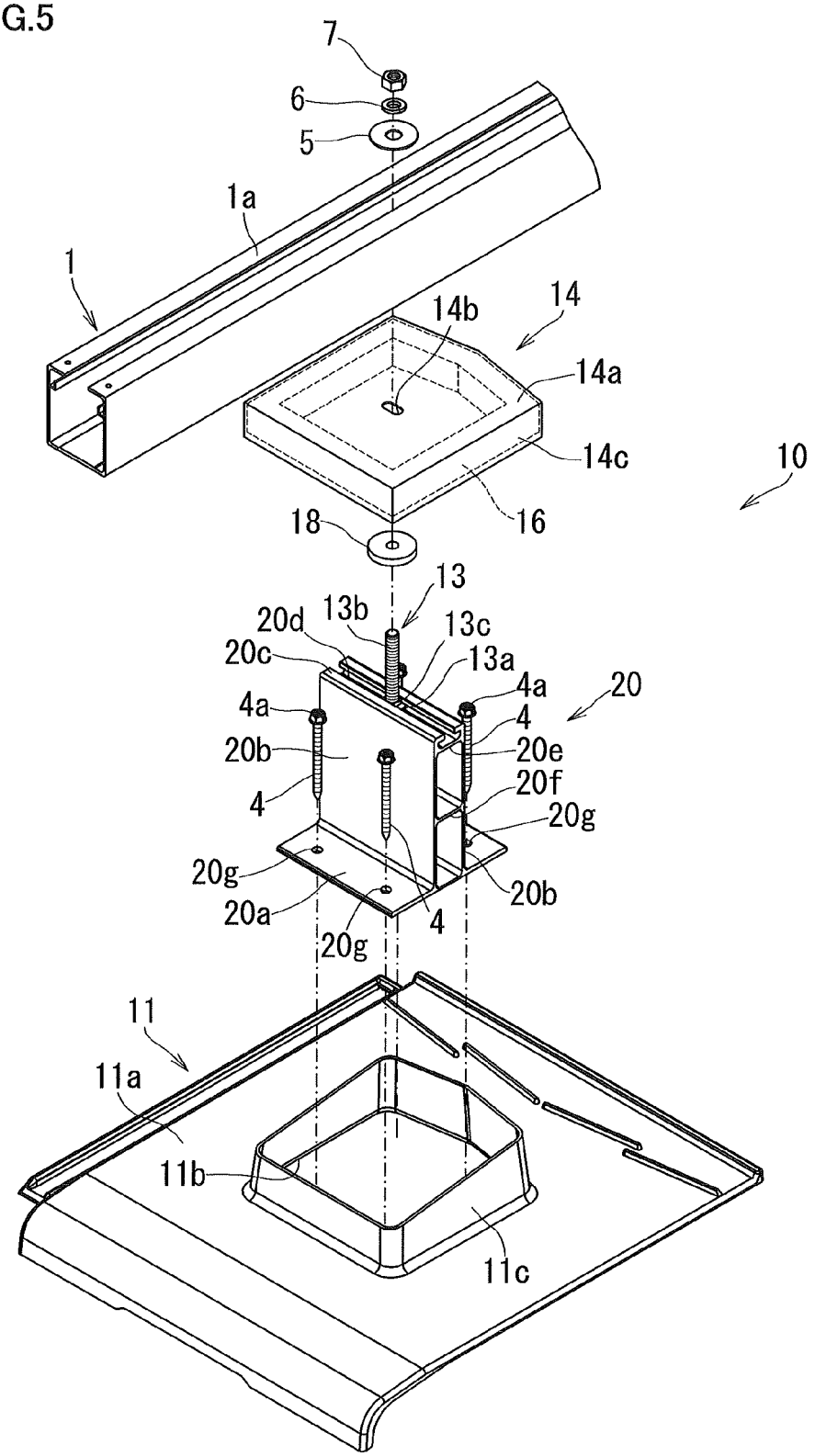
FIG. 5 is a perspective view illustrating the roof-installed object securing device in FIG. 4 in an exploded manner.
Figure 6:
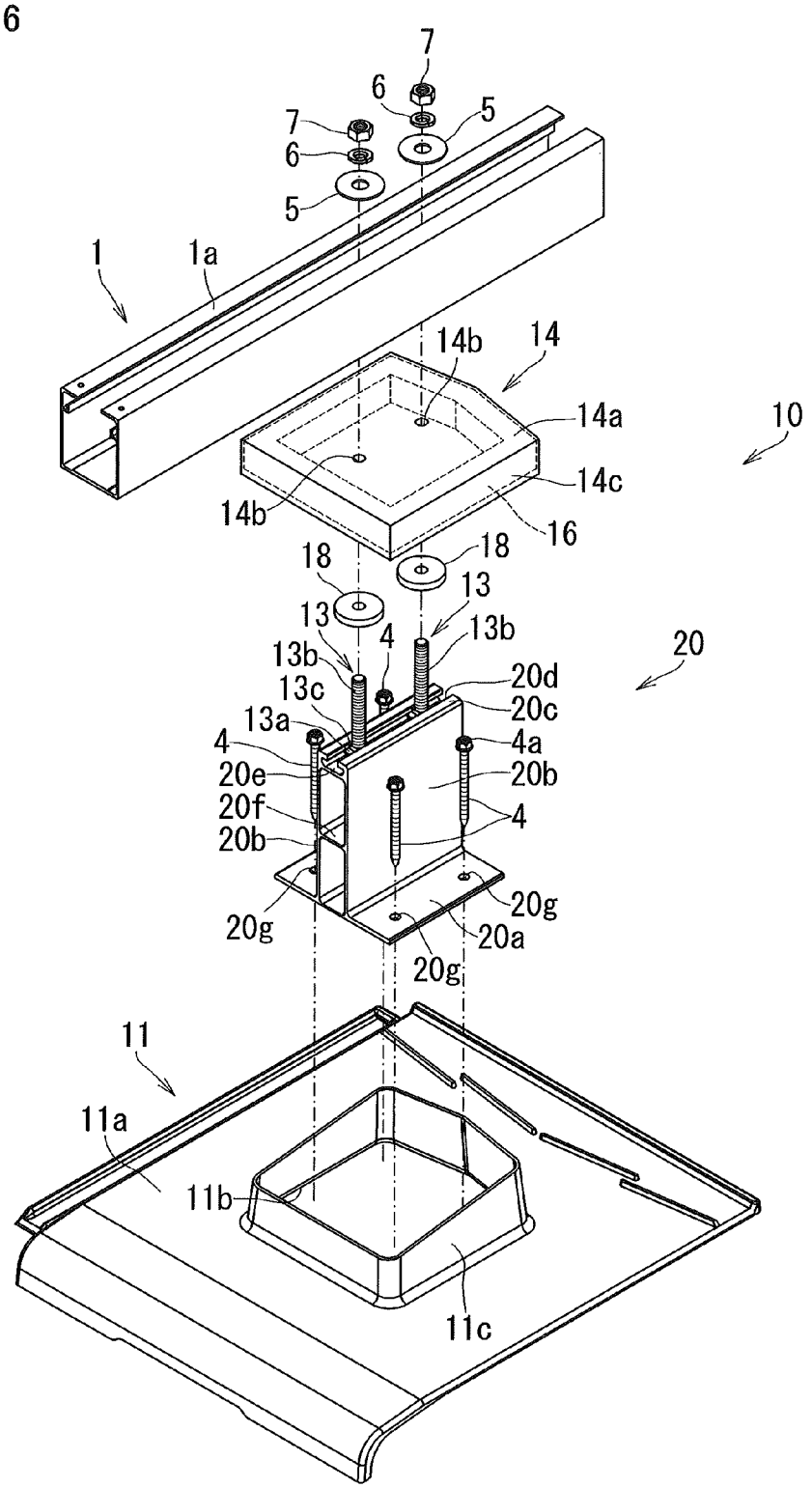
FIG. 6 is a perspective view illustrating another application example of the roof-installed object securing device in FIG. 4 in an exploded manner.

Although the securing member 12 is formed by bending one plate material in the above-mentioned embodiment, the securing member 12 is not limited to be formed in this manner. Alternatively, a securing member 20 formed with an extrusion molded material as illustrated in FIG. 4 to FIG. 6 may be configured. The embodiment as illustrated in FIG. 4 to FIG. 6 is different from the above-mentioned embodiment as illustrated in FIG. 1 to FIG. 3 in the securing member 20 only. Other configurations thereof are the same as those in the above-mentioned embodiment, so that the same reference numerals denote them and description thereof is omitted.

The securing member 20 includes a flat plat-like mounting piece 20*a*, a pair of flat plate-like erected portions 20*b* that are parallel with each other, a flat plate-like installing portion 20*c*, a slit 20*d*, a flat plate-like upper coupling extending piece 20*e*, and a flat plate-like intermediate coupling extending piece 20*f*. The mounting piece 20*a* abuts against the roof structural member 2. The pair of erected portions 20*b* are erected from the mounting piece 20*a*. The installing portion 20*c* couples the upper ends of the pair of erected portions 20*b* and extends in parallel with the mounting piece 20*a*. The slit 20*d* penetrates through the installing portion 20*c* in the up-down direction. The upper coupling extending piece 20*e* couples the pair of erected portions 20*b* under the installing portion 20*c*. The intermediate coupling extending piece 20*f* couples the pair of erected portions 20*b* between the upper coupling extending piece 20*e* and the mounting piece 20*a*.

The securing member 20 is formed with an extrusion molded material having a single cross sectional shape, such as aluminum alloy. The securing member 20 includes a plurality of mounting holes 20g penetrating through the mounting piece 20a at both the outer positions of the pair of erected portions 20b.

The slit 20d of the securing member 20 is formed to have the width slightly larger than one side of the square root portion 13c of the external thread member 13 and divides the installing portion 20c into two. Furthermore, the upper coupling extending piece 20e is formed at a position spaced downward from the lower surface of the installing portion 20c by a length slightly larger than the height of the head 13a of each external thread member 13. With this, the securing member 20 enables the square root portion 13c and the head 13a of the external thread member 13 to be inserted into the slit 20d and between the installing portion 20c and the upper coupling extending piece 20e, respectively, from the outsides of the end surfaces in the extruding direction and can restrict downward movement of the head 13a of the external thread member 13 with the upper coupling extending piece 20e. The upper coupling extending piece 20e of the securing member 20 corresponds to a restricting portion in the invention.

Subsequently, a method of securing the roof-installed object 1 by using the securing member 20 is described. First, the securing roof member 11 is mounted on the roof structural member 2 with the procedures same as those in the above-mentioned embodiment. As illustrated in FIG. 4 and FIG. 5, the securing member 12 is directed such that the direction in which the slit 20d of the securing member 20 extends is the direction perpendicular to the roof inclination direction and is inserted into the through-hole 11b of the securing roof member 11 from above, so that the mounting piece 20a is made to abut against the roof structural member 2. Thereafter, the screws 4 are screwed into the roof structural member 2 through the mounting holes 20g on the mounting piece 20a. With this, the securing member 20 is mounted on the roof structural member 2. The securing member 20 is also mounted on the roof structural member 2 while the sealing member 17 is inserted under the mounting piece 20a.

After the securing member 20 is mounted on the roof structural member 2, the square root portion 13c and the head 13a of the external thread member 13 are inserted into the slit 20d of the securing member 20 and between the installing portion 20c and the upper coupling extending piece 20e thereof, respectively. This makes into a state where the external thread portion 13b of the external thread member 13 extends upward from the installing portion 20c and the external thread member 13 is movable along the slit 20d in a non-rotatable manner.

Then, the waterproof member 18 is fitted to the external thread portion 13b extending upward from the securing member 20, and the cover member 14 is installed on the installing portion 20c while the external thread portion 13b passes through the through hole 14b formed thereon at the center with the procedures same as those described above. Thereafter, the crosspiece member 1a is secured to the external thread portion 13b extending upward from the cover member 14 with the procedures same as those described above, so that the roof-installed object 1 can be installed on the roof structural member 2.

In this embodiment, the securing member 20 is mounted on the roof structural member 2 such that the slit 20d extends in the direction perpendicular to the securing axial line of the crosspiece member 1a. Therefore, even after the securing member 20 is mounted on the roof structural member 2, the position of the external thread portion 13b can be changed with respect to the roof structural member 2 without detaching the securing member 20 by moving the external thread member 13 along the slit 20d. This can make the external thread portion 13b be identical to the securing axial line of the crosspiece member 1a. Furthermore, the slit 20d is formed on the securing member 20 from one end to the other end of the securing member 20 so as to cope with larger deviation with respective to the securing axial line of the crosspiece member 1a.

As illustrated in FIG. 6, the securing member 20 may be mounted on the roof structural member 2 such that the direction in which the slit 20d extends is directed to the direction same as the roof inclination direction. In this case, the slit 20d extends along the crosspiece member 1a, so that the plurality of (two in FIG. 6) external thread members 13 are mounted on the securing member 20 and the crosspiece member 1a is secured onto the external thread portions 13b of the plurality of external thread members 13 desirably. This can secure the roof-installed object 1 onto the roof structural member 2 firmly.

What is claimed is:

1. A roof-installed object securing device comprising:
   a securing roof member having a flat plate-like roof member main body that is mounted on a roof structural member, a through-hole that penetrates through the roof member main body in an up-down direction, and a peripheral wall portion that extends upward from a peripheral edge of the through-hole;
   a securing member having a flat plate-like mounting piece that is located below the roof member main body of the securing roof member, is provided with a plurality of mounting holes, and is made to abut against the roof structural member, an erected portion that is erected upward from the mounting piece to be higher than the peripheral wall portion through the through-hole, a flat plate-like installing portion that extends from an upper end of the erected portion so as to be in parallel with the mounting piece, and a slit that penetrates through the installing portion in an up-down direction;
   an external thread member having a head that abuts against a lower surface of the installing portion of the securing member and a bar-like external thread portion that extends upward from the head through the slit, and movable along the slit; and
   a cover member having a flat plate-like top board portion that is provided with a through-hole through which the external thread portion of the external thread member passes, is installed on the installing portion, and extends outward relative to an outer circumference of the peripheral wall portion, and a side plate portion that extends downward from a peripheral edge of the top board portion to a height between an upper end of the peripheral wall portion and an upper surface of the roof member main body,
   wherein a roof-installed object is secured onto the external thread portion extending upward from the cover member.

2. The roof-installed object securing device according to claim 1, wherein
   the securing member further includes a restricting portion that abuts against the head of the external thread member from below.

3. The roof-installed object securing device according to claim 1, wherein
   the securing member is formed to have such size that the securing member is capable of passing through the through-hole of the securing roof member.

4. The roof-installed object securing device according to claim 2, wherein
the securing member is formed to have such size that the securing member is capable of passing through the through-hole of the securing roof member.

\* \* \* \* \*